United States Patent [19]

Hoffmeyer et al.

[11] Patent Number: 5,769,989
[45] Date of Patent: *Jun. 23, 1998

[54] METHOD AND SYSTEM FOR REWORKABLE DIRECT CHIP ATTACH (DCA) STRUCTURE WITH THERMAL ENHANCEMENT

[75] Inventors: Mark Kenneth Hoffmeyer, Rochester, Minn.; David A. Sluzewski, San Jose, Calif.

[73] Assignee: International Business Machines Corporation, Armonk, N.Y.

[ * ] Notice: The term of this patent shall not extend beyond the expiration date of Pat. No. 5,601,675.

[21] Appl. No.: 530,452

[22] Filed: Sep. 19, 1995

[51] Int. Cl.⁶ .................................................. B32B 35/00
[52] U.S. Cl. ..................... 156/94; 156/344; 29/402.08; 228/191; 228/264; 428/458; 428/901; 438/118
[58] Field of Search .................. 156/94, 344; 29/402.03, 29/402.08, 762; 228/191, 264; 437/923, 209; 428/458, 901, 118

[56] References Cited

U.S. PATENT DOCUMENTS

| | | |
|---|---|---|
| 3,991,347 | 11/1976 | Hollyday . |
| 4,012,832 | 3/1977 | Crane ......................................... 29/575 |
| 4,360,144 | 11/1982 | Cuddy et al. . |
| 4,818,823 | 4/1989 | Bradley . |
| 4,893,216 | 1/1990 | Hagner . |
| 5,072,874 | 12/1991 | Bertram et al. . |
| 5,179,366 | 1/1993 | Wagner ..................................... 338/313 |
| 5,189,261 | 2/1993 | Alexander et al. . |
| 5,220,724 | 6/1993 | Gerstner . |
| 5,227,589 | 7/1993 | Weeks . |
| 5,268,048 | 12/1993 | Leibovitz et al. .......................... 156/94 |
| 5,270,903 | 12/1993 | McMichen et al. . |
| 5,290,624 | 3/1994 | Bujard . |
| 5,340,947 | 8/1994 | Credle et al. . |
| 5,368,219 | 11/1994 | Hogan et al. . |

FOREIGN PATENT DOCUMENTS

| | | |
|---|---|---|
| 2 241 333 | 8/1972 | Germany . |
| 2050906 | 1/1981 | United Kingdom ................... 228/264 |

*Primary Examiner*—Mark A. Osele
*Attorney, Agent, or Firm*—Andrew J. Dillon

[57] ABSTRACT

A configuration of surface-mounted circuit assembly has four layers, namely, an integrated circuit device, an adhesive layer, a solder layer and the carrier board. The integrated circuit device is attached to the solder layer which sets on top of the carrier board, with the adhesive layer between the integrated circuit device and the solder layer. The carrier board has at least one via located beneath where the integrated circuit is located. The via is filled with solder such that the solder layer at which the integrated circuit device is situated is thermo-conductively connected to the back side of the carrier board. This configuration allows the integrated circuit device to be easily removed from the carrier board by the application of heat to the back side of the carrier board.

7 Claims, 2 Drawing Sheets

METHOD AND SYSTEM FOR REWORKABLE DIRECT CHIP ATTACH (DCA) STRUCTURE WITH THERMAL ENHANCEMENT

CROSS-REFERENCE TO RELATED APPLICATION

The present application is related to co-pending application Ser. No. 08/349,854, now U.S. Pat. No. 5,601,675 filed on Dec. 6, 1994 by inventors herein named and assigned to the assignee herein named. That application is incorporated herein by reference.

BACKGROUND OF THE INVENTION

1. Technical Field

The present invention relates to surface mounting operations in general, and in particular to a method and system for surface mounting electronic circuit assemblies. Still more particularly, the present invention relates to a method and system for surface mounting electronic circuit assemblies to allow easy removal of any wire-bonded surface-mounted integrated circuits on a carrier board.

2. Description of the Prior Art

Surface mounting or direct chip attach (DCA) operations that involve the wirebonding of integrated circuit (IC) devices for electrical interconnection to carrier boards are commonly utilized throughout the electronics industry in many applications where high interconnection density, minimal number of interconnections, package space minimization, and enhanced thermal performance of IC devices are required. For most DCA operations, IC devices are usually bonded to carrier boards utilizing either conductive or non-conductive adhesives that are applied to the carrier board surface. However, once the IC device is placed and the adhesive is cured, this bond configuration is not reworkable. Therefore, expensive IC devices or carrier boards cannot be salvaged if there are defects that render the IC devices or carrier boards non-functional. Thus, a method that allows for DCA reworkability can provide tremendous savings in cost. For example, estimates for provisions of such a method on dynamic direct access storage device actuator flex circuitry indicate that for a 2% IC fallout on cables, a net annual savings ranging from approximately $500K to $2M could be realized. Hence, it is clear that the development of a reworkable configuration for DCA structure is of critical importance to attain high yields and cost-effective manufacturing of surface-mounted electronic circuit assemblies.

Known prior art systems such as those discussed in Gerstner (U.S. Pat. No. 5,220,724) and Bertram et al. (U.S. Pat. No. 5,072,874) teach the use of meltable integrated circuit device adhesives which soften when heated to allow for the removal of integrated circuit device. After the removal of the IC device; however, the residues of these adhesives remain on the carrier board. The residues must be removed before the integrated circuit device site can be used again. The redress operation of the contaminated integrated circuit device site requires either the use of harsh solvents or mechanical grinding that is very time consuming, expensive, and may even result in damaging the carrier board. Because of low rework yield and suspect reliability, such meltable integrated circuit device adhesives are seldom used.

SUMMARY OF THE INVENTION

It is therefore an object of the present invention to provide an improved method for surface mounting of integrated circuit devices.

It is another object of the present invention to provide an improved method and system for surface-mounted electronic circuit assemblies.

It is yet another object of the present invention to provide an improved method and system for easy removal of wire-bonded surface-mounted integrated circuits on a carrier board.

In accordance with the method and system of the present invention, the surface-mounted circuit assembly has four layers, namely, an integrated circuit device, an adhesive layer, the solder layer and the carrier board. The integrated circuit device is removably attached to a solder layer which is disposed on top of the carrier board, with an adhesive layer disposed between the integrated device and the solder layer. The carrier board includes at least one aperture or "via" disposed beneath the location where the integrated circuit device is to be mounted. The via is filled with solder such that the solder layer upon which the integrated circuit device is situated is thermo-conductively connected to the back side of the carrier board. This configuration allows an integrated circuit device to be easily removed from the carrier board by the local application of heat to the back side of the carrier board.

BRIEF DESCRIPTION OF THE DRAWINGS

The invention itself as well as a preferred mode of use, further objects and advantage thereof, will best be understood by reference to the following detailed description of an illustrative embodiment when read in conjunction with the accompanying drawings, wherein.

DETAILED DESCRIPTION OF PREFERRED EMBODIMENT

Figure 1:
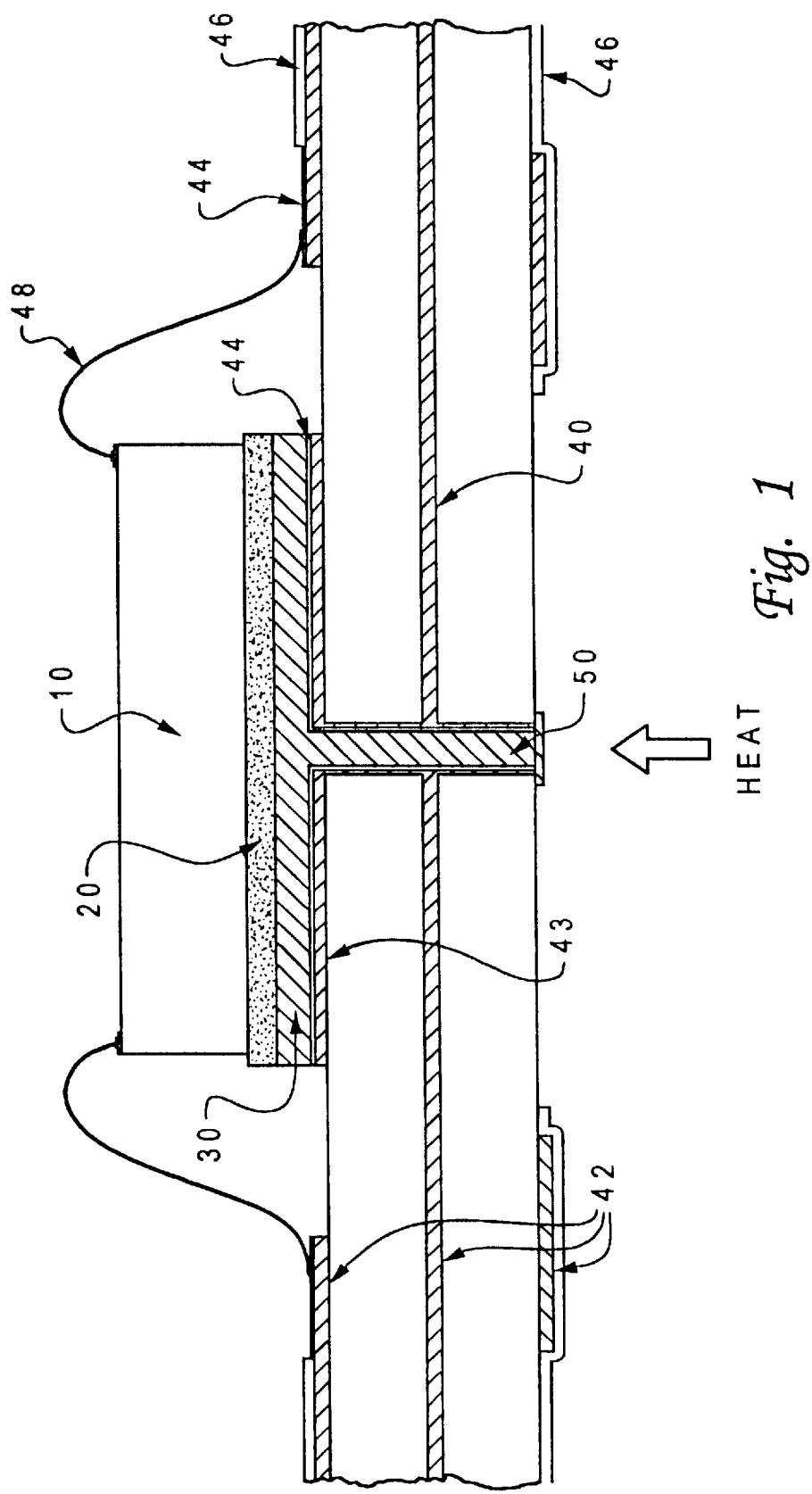
FIG. 1 is a cross-sectional view of a surface-mounted circuit assembly according to the preferred embodiment of the present invention.

FIG. 1 illustrates an integrated circuit device 10 which is mounted to a carrier board 40. In order to be suitable for surface mounting purposes, carrier board 40 typically includes metal traces 42, device mounting pad 43, wirebondable overplate layers 44 (such as Au over Ni), and a solder mask 46. According to a preferred embodiment of the invention, a metal-coated via 50 is provided through carrier board 40. The metal-coated via 50 is located beneath integrated circuit device 10 and is electrically and thermally connected to device mounting pad 43. In addition, integrated circuit device 10 is also electrically connected to wirebondable overplate layers 44 through metal bondwires 48.

According to a preferred embodiment of the present invention, a solder layer 30 is disposed on the pad site of integrated circuit device 10 by a solder application process such as wave soldering or application of solder paste to the solder pad. For a wave soldering process, the solder flows through via 50 and subsequently coats an even layer of solder on the device pad of integrated circuit device 10 to form the solder layer 30. For a solder paste process, the addition of solder involves standard techniques such as stencilling or screening solder paste followed by vapor-phase reflow, or reflow by infrared radiation, hot air, or a hot plate. The subsequent reflow of solder paste results in the formation of a solder coating on a device pad. Furthermore, for these solder application processes, via 50 is filled with solder such that the solder layer 30 is electrically and thermally connected to the back side of the carrier board 40. An integrated circuit device 10 is then applied to the solder layer 30 with an adhesive layer 20.

Thereafter, should integrated circuit device 10 become defective for any reason, it can be dislodged, after the removal of metal bondwires 48, by simply applying heat locally to the back side of the carrier board 40 at which via 50 is located. A hot gas of temperature sufficient to melt solder layer 30 from a conventional hot-gas rework tool, for example, can be applied locally to the back side of the carrier board 40 at which via 50 is located. The heat subsequently transmits through via 50 to melt the solder layer 30. Then, the integrated circuit device 10 along with the adhesive layer 20 can easily be removed from the surface of the carrier board 40. The removal of the defective integrated circuit device 10 may be accomplished by lifting the device 10 away from the carrier board 40 with a specific device-handler (not shown). Because adhesive layer 20 is of a non-meltable nature, it will stay adhered to the bottom side of the integrated circuit device 10 as the integrated device 10 is being lifted away, without leaving any residue behind. Hence, the device site is ready to use without additional cleaning or redressing. Furthermore, because heat is only applied locally to the via, there is no potential risk of damaging the defective device site or the adjacent sites due to overheating.

Solder layer 30 may be a layer of ordinary solder, a special type of solder such as lead-free, a brazing alloy, or any other substance compatible with the carrier board material and the wiring. In addition, the melting temperature of the substance used as solder layer 30 must exceed the normal operating temperature of the circuit assembly, and must be low enough that it can flow and reflow without damaging the material of the carrier board; melting temperature is typically in the range of 100° C. to 400° C. Solder layer 30 normally covers device pad areas in the range of 2–25mm on a side, and has a conventional thickness of approximately 0.001–0.25mm. The thickness of the solder layer is determined by known considerations such as metal reactivity and adequate liquid film formation for subsequent device removal.

A variety of adhesives can be used as adhesive layer 20. The adhesive material may be thermally conductive or insulative, as well as electrically conductive or insulative. However, the adhesive material need not be heat-softenable in order to provide rework capability. This allows the use of some adhesive materials which sacrifice softenability or tearability in order to achieve higher bond strength or other desirable properties. Electrically insulating adhesives can be made electrically conductive by impregnating them with metal particles. Otherwise, electrically insulating adhesives can be made thermally conductive by impregnating them with particles of diamond, BN, AlN, silica, ZnO, etc. Examples of adhesive materials that can be used as adhesive layer 20 are electrically conductive Ablestik™ 84-LMI or electrically/thermally insulative Ablestik™ 84-3.

Figure 2:
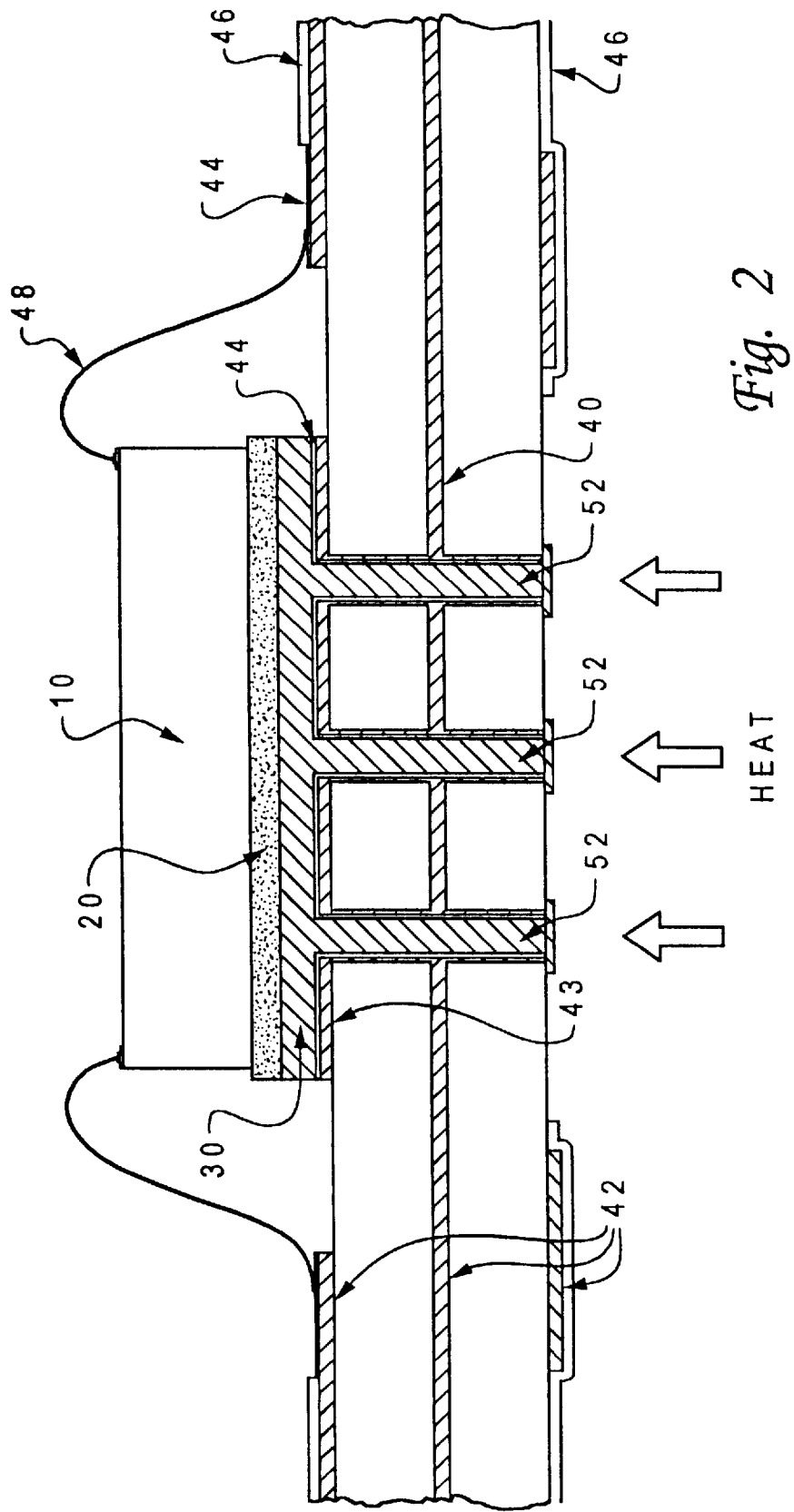
FIG. 2 is an alternative embodiment of the present invention in which a multiple number of vias is used.

As an alternative embodiment of the invention, a multiple number of vias can be used at the device sites throughout the carrier board 40. For example, in FIG. 2, three vias 52 are shown to be used underneath integrated circuit device 10. Similar to the one via configuration in FIG. 1, a solder layer 30 is disposed on the pad site of integrated circuit device 10 by a solder application process such as wave soldering or application of solder paste to the solder pad. For the wave soldering process, the solder flows through vias 52 and subsequently coats an even layer of solder on the device pad of integrated circuit device 10 to form the solder layer 30. For solder paste process, the subsequent reflow of solder paste results in the formation of a solder coating on a device pad. Furthermore, for these solder application processes, all vias 52 are also filled with solder such that the solder layer 30 is electrically and thermally connected to the back side of the carrier board 40. The integrated circuit device 10 is subsequently attached to solder layer 30 with an adhesive layer 20 in between the integrated circuit device 10 and solder layer 30.

This surface-mounted circuit assembly configuration provides a reworkable structure for efficient and cost effective device removal and replacement. Furthermore, the vias also provide an in-service thermal enhancement to the integrated circuit devices on the carrier board.

The present invention is applicable to all wirebonding technology, where the integrated circuit devices are wirebonded to either a variety of substrate materials (such as FR4, polyimide, ceramic, metal and thin film) or leadframes as is in the case for most plastic packages such as SOIC, PQFP, PLCC, DIP, etc.

It is also important to note that the concepts under the present invention could also be used to provide reworkability for any electrical component interconnections with the use of conductive adhesives as well. This may become extremely important in future applications when the use of lead-free systems are of primary concern in environmentally conscious products. For example, leaded components could be bonded to pads on a carrier board coated with a tin based leadfree solder with a conductive adhesive similar to those used for wirebonded integrated circuit attach. The fusible lead-free solder on the pad surface could then be melted to allow for reworkability of the adhesive attached component leads. Thus, the present invention also possesses a broad range of applicability within the realm of electronic packaging well beyond the use for rework of wirebonded integrated circuit devices.

What is claimed is:
1. A surface-mounted circuit assembly comprising:
   a carrier board having an upper surface and a lower surface, wherein said carrier board has a plurality of vias therethrough;
   at least one mounting site on said upper surface of said carrier board;
   a solder layer disposed on said upper surface of said carrier board at said at least one mounting site, covering and filling at least a portion of said plurality of vias, wherein any layers that may be disposed between said solder layer and said at least one mounting site are metallic;
   an integrated circuit device having an upper surface and a lower surface; and
   an adhesive layer connecting said lower surface of said integrated circuit device to said solder layer, wherein said integrated circuit device may be easily removed from said carrier board by the application of heat to said lower surface of said carrier board at locations of said plurality of vias.

2. The surface-mounted circuit assembly of claim 1, wherein said adhesive layer is non-meltable when heat is applied to said plurality of vias.

3. The surface-mounted circuit assembly of claim 1, wherein said solder layer is lead free.

4. The surface-mounted circuit assembly of claim 1, wherein said adhesive layer is thermally and electrically conductive.

5. The surface-mounted circuit assembly of claim 1, wherein said adhesive layer is thermally and electrically insulative.

6. A method for removably mounting an integrated circuit device to a surface-mounted circuit assembly, wherein said surface mounted circuit assembly includes a carrier board having an upper surface and a lower surface, wherein said carrier board has at least one via therethrough and at least one mounting site on said upper surface of said carrier board, said method comprising the steps of:

disposing a solder layer on said upper surface of said carrier board at said at least one mounting site, filling and covering a portion of said at least one via, wherein any layers that may be disposed between said solder layer and said at least one mounting site are metallic; and mounting said integrated circuit device to said upper surface of said carrier board utilizing an adhesive layer connecting a lower surface of said integrated device to said solder layer;

wherein said integrated circuit device and said adhesive layer can be removed from said upper surface of said carrier board by applying heat to said at least one via at the lower surface of said carrier board.

7. The method for removably mounting an integrated circuit device to a surface-mounted circuit assembly in claim 6, wherein said application of heat comprises applying a hot gas locally to said at least one via at said lower surface of said carrier board.

\* \* \* \* \*